US008664738B2

(12) United States Patent
Sugahara et al.

(10) Patent No.: US 8,664,738 B2
(45) Date of Patent: Mar. 4, 2014

(54) SOLID-STATE IMAGING APPARATUS HAVING A TRANSLUCENT MEMBER

(75) Inventors: Ken Sugahara, Kanagawa (JP); Satoru Takahashi, Fukushima (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 13/369,889

(22) Filed: Feb. 9, 2012

(65) Prior Publication Data
US 2012/0205768 A1    Aug. 16, 2012

Related U.S. Application Data

(63) Continuation of application No. PCT/JP2011/002262, filed on Apr. 18, 2011.

(30) Foreign Application Priority Data

Aug. 4, 2010 (JP) .................................. 2010-175661

(51) Int. Cl.
*H01L 27/146* (2006.01)

(52) U.S. Cl.
USPC .............. 257/443; 348/373; 348/340; 396/71

(58) Field of Classification Search
USPC ....................... 257/443; 348/373, 340; 396/71
See application file for complete search history.

(56) References Cited

U.S. PATENT DOCUMENTS

| 6,288,851 B1* | 9/2001 | Tomita ........................... 359/809 |
| 6,674,159 B1* | 1/2004 | Peterson et al. .............. 257/680 |
| 7,091,571 B1* | 8/2006 | Park et al. ...................... 257/432 |
| 2001/0003494 A1* | 6/2001 | Kitagawa ....................... 359/718 |
| 2001/0048064 A1 | 12/2001 | Kitani |
| 2004/0041221 A1* | 3/2004 | Boon et al. .................... 257/433 |
| 2005/0169620 A1 | 8/2005 | Minamio et al. |

(Continued)

FOREIGN PATENT DOCUMENTS

| EP | 1605520 A1 | 12/2005 |
| JP | 2001-284413 | 10/2001 |

(Continued)

OTHER PUBLICATIONS

International Search Report issued in International Patent Application No. PCT/JP2011/002262 dated May 17, 2011.
Extended European Search Report dated Jul. 8, 2013, issued in European Application No. 11814216.5.

*Primary Examiner* — Kimberly Rizkallah
*Assistant Examiner* — Caleb Henry
(74) *Attorney, Agent, or Firm* — McDermott Will & Emery LLP

(57) ABSTRACT

A solid-state imaging apparatus including an insulating structural body having a through opening, a wiring part formed on a front surface of the structural body, a solid-state imaging element which is connected to the wiring part and also is attached to the structural body so as to close the through opening, a translucent member which is opposed to the solid-state imaging element and is attached to the structural body through an adhesive inside an adhesion region R so as to close the through opening, and a solder resist film with which at least a part of the front surface of the structural body is covered, and is characterized in that a region R0 in which the solder resist film is selectively removed is had in the adhesion region R and the removed region R0 is filled with the adhesive.

3 Claims, 7 Drawing Sheets

(56) References Cited

U.S. PATENT DOCUMENTS

2005/0259174 A1 11/2005 Nishio et al.
2008/0298034 A1* 12/2008 Park et al. .................... 361/783
2010/0045832 A1* 2/2010 Mochiduki .................. 348/294

FOREIGN PATENT DOCUMENTS

| JP | 2005-252223 | 9/2005 |
| JP | 2006-013440 | 1/2006 |
| JP | 2008-263550 | 10/2008 |

* cited by examiner

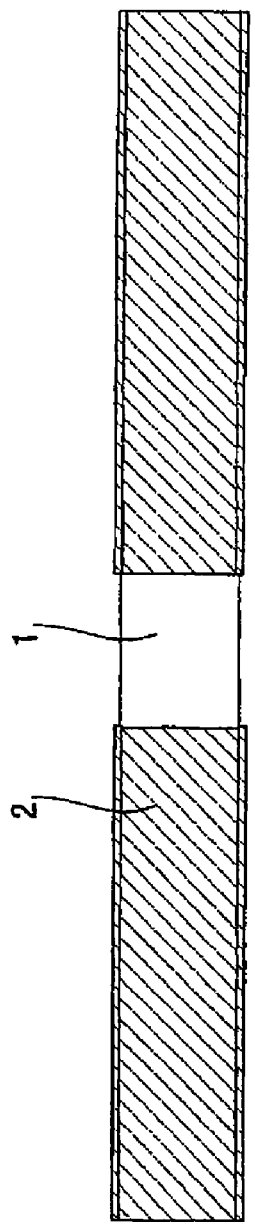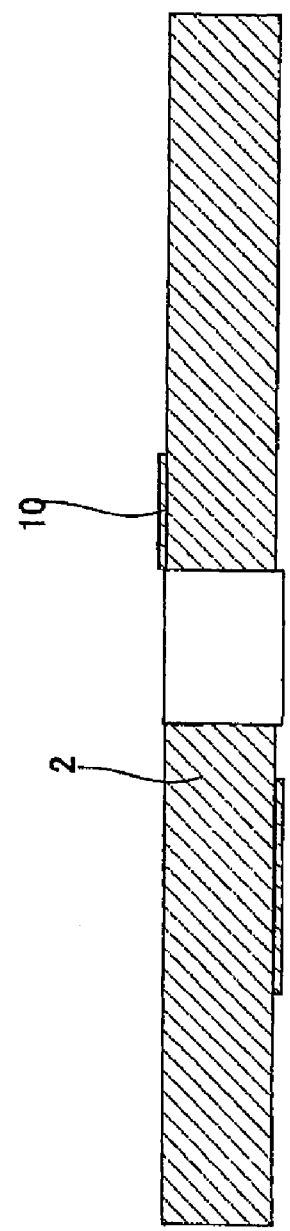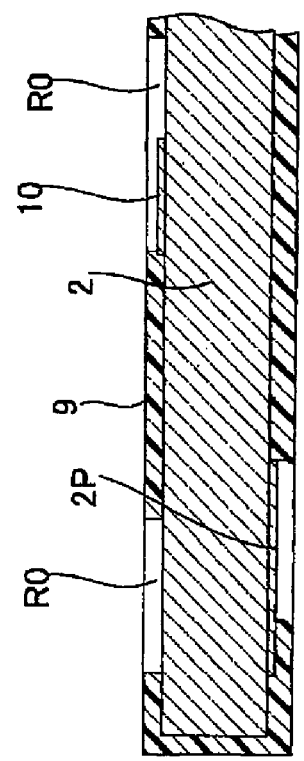
FIG. 4 (a)
FIG. 4 (b)
FIG. 4 (c)

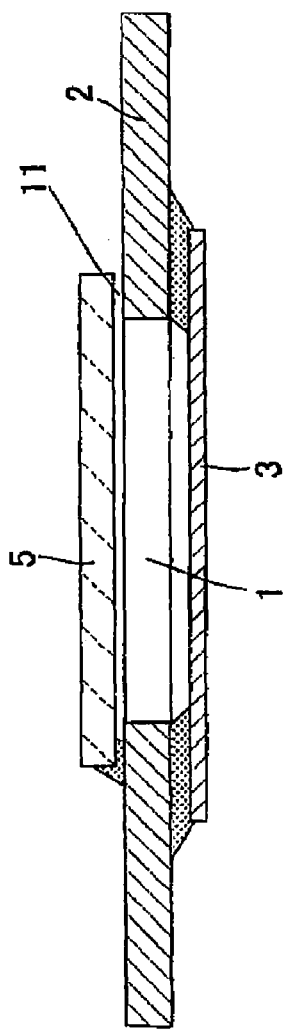
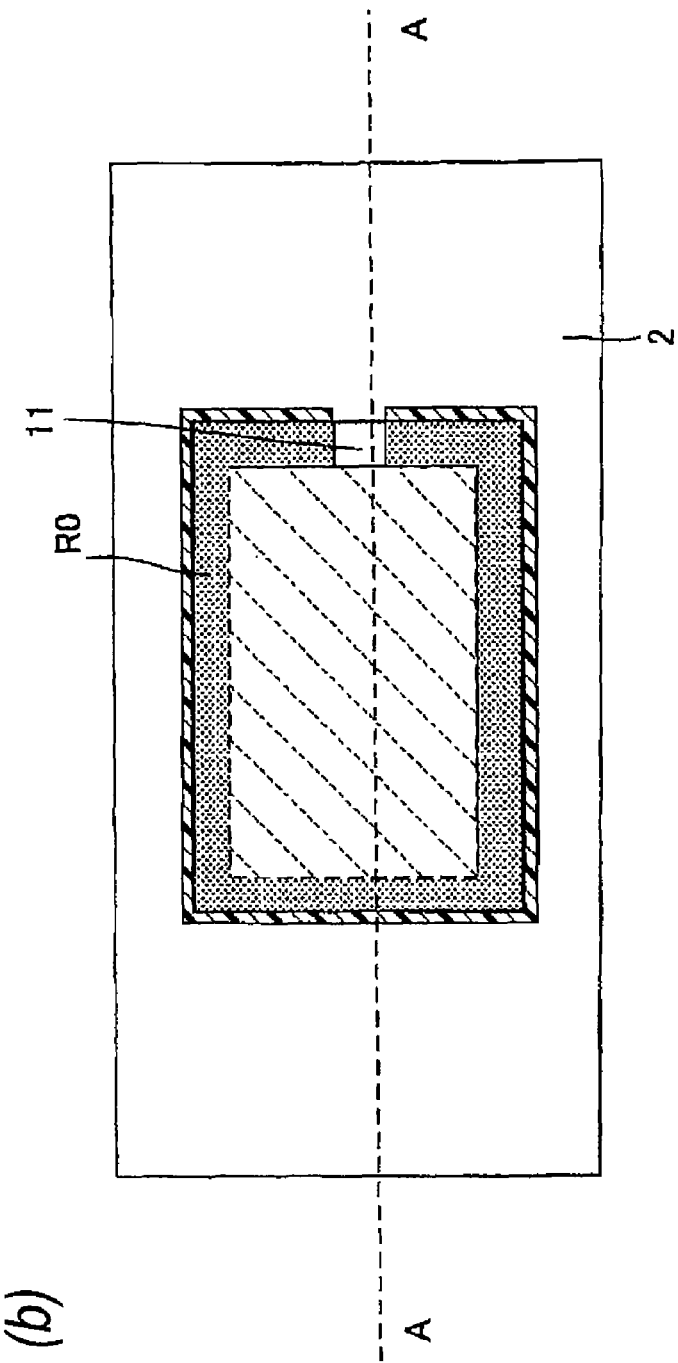
FIG. 5 (a)
FIG. 5 (b)

SOLID-STATE IMAGING APPARATUS HAVING A TRANSLUCENT MEMBER

RELATED APPLICATIONS

This is a continuation of PCT International Application PCT/JP2011/002262 filed on Apr. 18, 2011, which claims priority to Japanese Patent Application No. 2010-175661 filed on Aug. 4, 2010. The disclosures of these applications including the specifications, the drawings, and the claims are hereby incorporated by reference in their entirety.

BACKGROUND OF THE INVENTION

1. Field of the Invention

The present invention relates to a solid-state imaging apparatus, and particularly to a miniature solid-state imaging apparatus formed using a solid-state imaging element.

2. Description of the Related Art

In recent years, demand for a miniature camera rapidly increases in a filed of mobile telephone, a vehicle-mounted component, etc. A so lid-state imaging apparatus for outputting an image inputted through an optical system such as a lens as an electrical signal by a solid-state imaging element is used in this kind of miniature camera. Then, with high performance and miniaturization of this imaging apparatus, use in each field increases and the market as a video input apparatus is expanded. In an imaging apparatus using a conventional solid-state imaging element, components such as an LSI in which a lens, a solid-state imaging element, its driving circuit and a signal processing circuit, etc. are installed are respectively formed in a cabinet or a structural body and these are combined.

Incidentally, positioning and fixing are required in the case of mounting the solid-state imaging element in the cabinet or the structural body. A structure using a flexible wiring board as a mounting substrate is proposed in the case of mounting the solid-state imaging element (Patent Reference 1).

This example proposes a solid-state imaging apparatus in which a reinforcing plate is pasted on a flexible wiring board and a solid-state imaging element substrate, a translucent member, an optical lens and a lens cabinet, are attached to this pasted body. In this case, the flexible wiring board and the reinforcing plate have the same outer shape and are laminated and integrated, and a hole for positioning for being used in common from the front and back as the reference in the case of placing solid-state imaging element substrate and the case of placing the lens cabinet is formed in the reinforcing plate, and the translucent member is placed so as to close an opening part and using the hole for positioning as a common reference, the solid-state imaging element substrate and the lens cabinet are oppositely placed with a through opening sandwiched between the solid-state imaging element substrate and the lens cabinet and are connected through an adhesive.
Patent Reference 1: JP-A-2008-263550

In the mounting structure shown in Patent Reference 1, it is difficult to perform control of a thickness of an adhesive, and there are problems of causing peeling of the translucent member due to too thin a thickness of the adhesive or inclination of the translucent member due to variations in thickness.

When inclination is caused in the translucent member, there are problems of causing variations in incident light which reaches the solid-state imaging element or having the risk of interfering with a jig or other components, for example, at the time of conveyance of a post-step.

SUMMARY OF THE INVENTION

The invention has been implemented in view of the actual circumstances described above, and an object of the invention is to provide a solid-state imaging apparatus capable of placing a translucent member without causing inclination in the translucent member.

Hence, a solid-state imaging apparatus of the invention includes an insulating structural body formed with a through opening, a wiring part formed on a surface of the structural body, a solid-state imaging element connected to the wiring part and attached to the structural body so as to close the through opening, a translucent member opposed to the solid-state imaging element so as to close the through opening and attached to the structural body through an adhesive inside an adhesion region, and a solder resist film covering at least a part of the front surface of the structural body, and wherein the adhesion region includes a region in which the solder resist film is selectively removed and the removed region is filled with the adhesive.

Also, the invention includes the solid-state imaging apparatus wherein the adhesion region is surrounded by the solder resist film.

Also, the invention includes the solid-state imaging apparatus wherein the adhesion region constructs a communication region.

Also, the invention includes the solid-state imaging apparatus wherein a film thickness of the adhesive is constructed so as to become thicker than that of the solder resist film and a region sandwiched in a region in which the solder resist film is removed constructs an air escape part.

Also, the invention includes the solid-state imaging apparatus wherein a dust trap pocket is had inside the air escape part.

Also, the invention includes the solid-state imaging apparatus wherein a meander-shaped pattern is formed in a region in which the solder resist film is removed, constructing a dust trap pocket in the air escape part.

Thus, according to the configuration described above, by providing a front surface of a substrate with the region in which the resist is removed, substantially a constant thickness of the adhesive can be ensured, and inclination of the translucent member or trouble such as peeling of the translucent member resulting from variations in adhesion thickness can be prevented.

Also, the region in which the resist is removed is selectively filled with the adhesive, so that the need for a sophisticated process for ensuring the adhesive thickness is eliminated.

BRIEF DESCRIPTION OF THE DRAWINGS

FIGS. 4(a) to 4(c) are diagrams showing a manufacturing step of a structural body of the solid-state imaging apparatus of the first embodiment.

FIGS. 5(a) and 5(b) are views showing a solid-state imaging apparatus of a second embodiment and FIG. 5(a) is a sectional view and FIG. 5(b) is a top view.

DESCRIPTION OF THE PREFERRED EMBODIMENTS

Embodiments of the invention will hereinafter be described in detail with reference to the drawings.

First Embodiment

Figure 1:
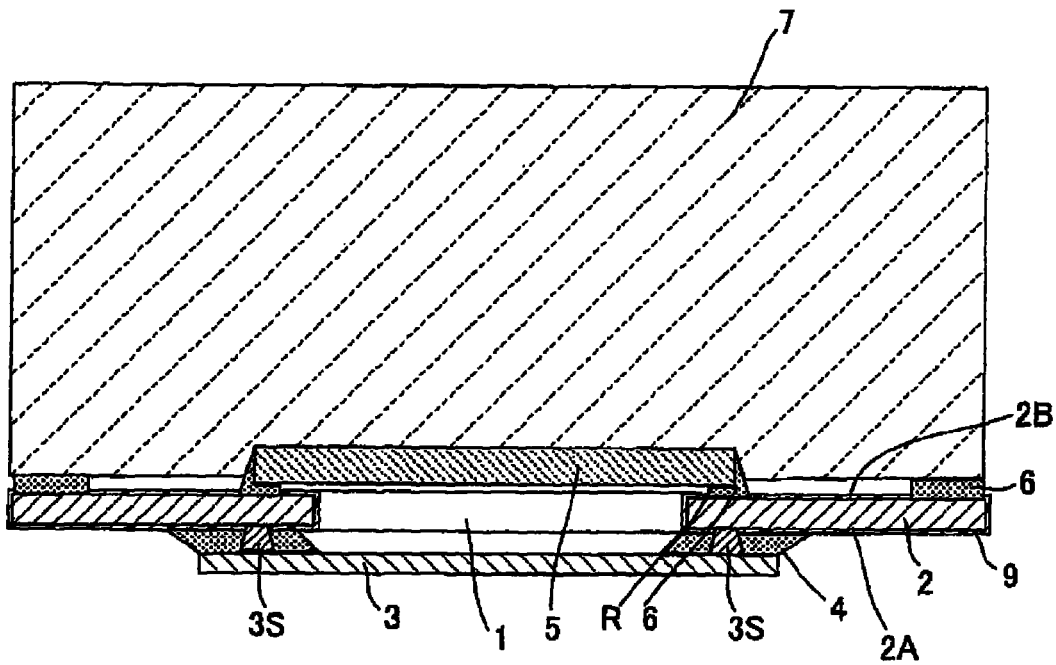
FIGS. 1(a) and 1(b) are views showing a solid-state imaging apparatus of a first embodiment and FIG. 1(a) is a sectional view and FIG. 1(b) is a top view.
Figure 1:
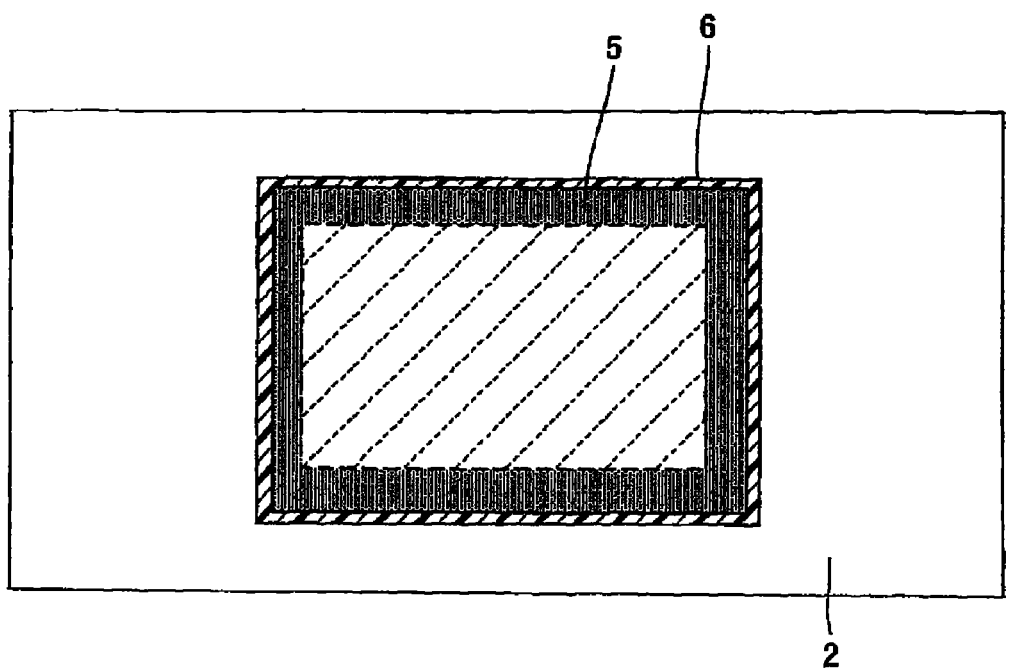
Figure 2:
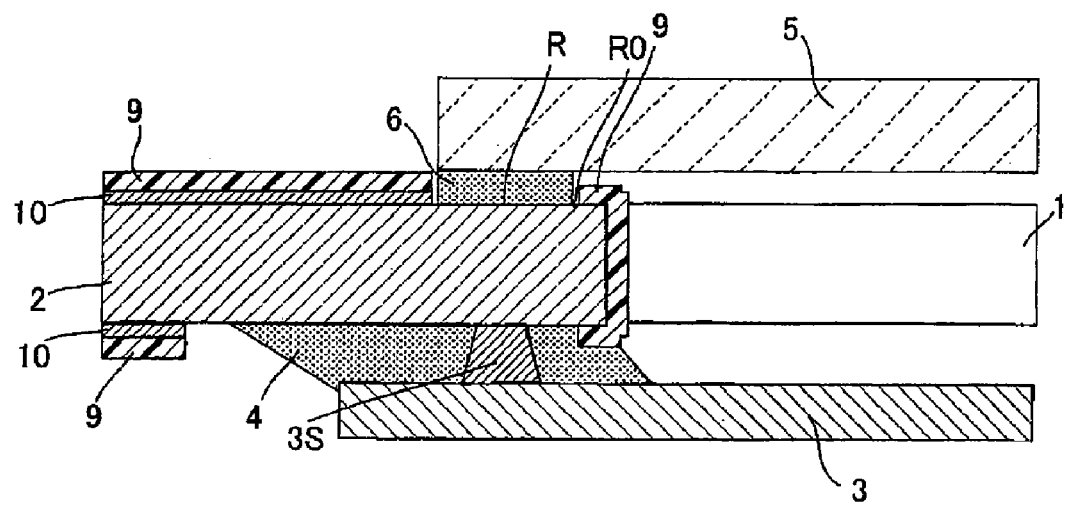
FIG. 2 is a main enlarged view of FIG. 1(a).
Figure 3:
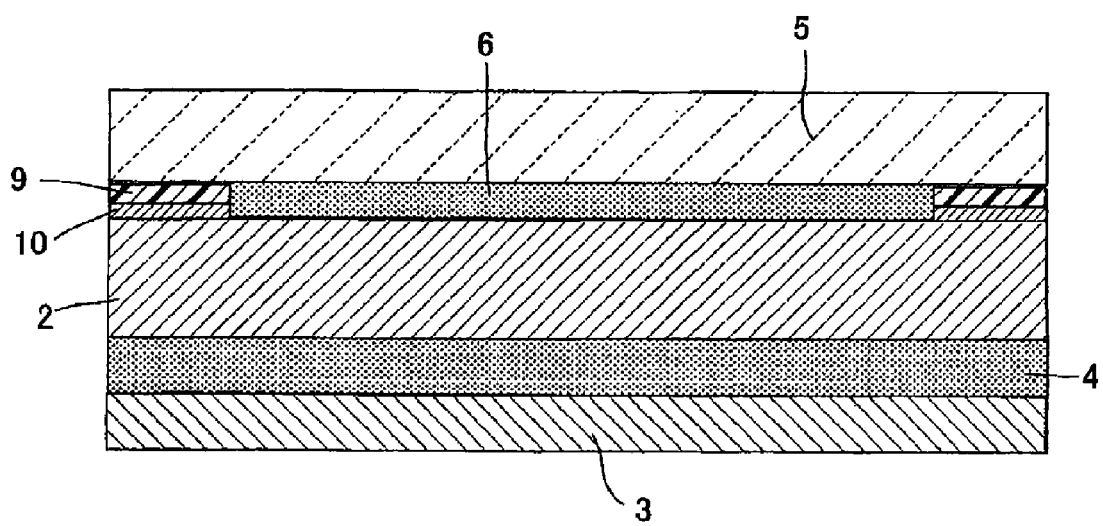
FIG. 3 is a main enlarged view of FIG. 2.

FIGS. 1(a) to 3 show a solid-state imaging apparatus of a first embodiment of the invention. FIG. 1(a) is a schematic sectional view and FIG. 1(b) is a top view of this solid-state imaging apparatus, and FIG. 2 is a main enlarged view of FIG. 1(a), and FIG. 3 is a further main enlarged view of FIG. 2. FIGS. 4(a) to 4(c) are diagrams showing a manufacturing step of a structural body of this solid-state imaging apparatus.

This solid-state imaging apparatus includes an insulating structural body 2 having a through opening 1, a wiring part 10 formed on a front surface of this structural body 2, a solid-state imaging element 3 which is connected to the wiring part 10 and also is attached to the structural body 2 so as to close the through opening 1, a translucent member 5 which is opposed to the solid-state imaging element 3 and is attached to the structural body 2 through an adhesive 6 inside an adhesion region R so as to close the through opening 1, and a solder resist film 9 with which at least a part of the front surface of the structural body 2 is covered, and is characterized in that a region R0 in which the solder resist film 9 is selectively removed is had in the adhesion region R and this removed region is filled with the adhesive 6.

That is, this solid-state imaging apparatus is constructed of an insulating epoxy resin, and the solid-state imaging element 3 electrically connected through the wiring part 10 formed on the front surface of the structural body 2 is attached to a first surface 2A of the structural body 2 having the through opening 1 by a sealing resin material 4. This solid-state imaging element 3 is electrically connected through the wiring part 10 formed on the front surface of the structural body 2 and is attached by the sealing resin material 4. Then, on a second surface 2B, the translucent member 5 is attached to the structural body 2 constructing a circuit substrate through the adhesive 6 so as to be opposed to this solid-state imaging element 3 and close the through opening 1. Also, a lens unit 7 is attached to the structural body 2 through the adhesive 6 on the second surface 2B which is the same surface as an attachment surface of the translucent member 5. In addition, in the embodiment, except for an adhesion region of a front surface region of the structural body 2 abutting on bumps 3S of the solid-state imaging element 3, the whole is covered with the solder resist film 9.

The translucent member 5 is attached to the structural body 2 through the adhesive 6 so as to be opposed to the solid-state imaging element 3 and close the through opening 1. On the front surface of the structural body, a region in which the solder resist film 9 is selectively removed is formed and an uneven structure is provided. By this uneven structure, an adhesive thickness of about 30 μm or more can be ensured and variations in thickness in each place of the adhesion region R can be maintained within about 10 μm.

Then, a laminated structure of the solder resist film 9 and the wiring part 10 made of a wiring pattern or the solder resist film 9 is included on the front surface of the structural body 2, but most of the supply area of the adhesive 6 is not provided with the structure. By attaching the translucent member 5 to the structural body 2, to which a proper amount of adhesive 6 is supplied, formed in this manner, a distance between the structural body 2 and the translucent member 5 is determined by a thickness of the laminated structure of the solder resist film 9 and the wiring part 10, and the adhesive thickness also becomes equal to the thickness of this laminated structure.

A solder resist used in the embodiment is a thermosetting resin film formed on a circuit substrate so that solder does not adhere to the portion which does not require soldering, the resin film in which an adhesive formation region and a pad formation region which requires soldering are exposed. Here, an acrylate resin using PSR-4000 EG30 as a principal agent and CA-40G23K as a curing agent manufactured by TAIYO INK CO., LTD. is used as the solder resist. Normally, the solder resist is applied in the final stage of a manufacturing step of a printed substrate, that is, the structural body. A green or yellow green solder resist is mainly used, but blue, red and other colored solder resists are also used. A solder resist in which a flame-retardant material such as chlorine or bromine is included in a green pigment is used, but an environment-conscious (halogen-free) resist using a blue resist which does not require these materials is developed as environmental measures, and an adoption example of the resist increases together with an environment-conscious printed wiring board base material. At present, a green resist which does not include chlorine or bromine is also developed. The solder resist is properly selected from these solder resists and is used.

The structural body 2 constructing the circuit substrate used herein is formed in the following manner. FIGS. 4(a) to 4(c) are diagrams showing a manufacturing step of the structural body of the solid-state imaging apparatus.

First, as shown in FIG. 4(a), the through opening 1 is formed on a substrate for constructing the structural body 2 constructing the circuit substrate in which copper foil is stuck on both surfaces.

Next, as shown in FIG. 4(b), this copper foil is patterned and the wiring part 10 made of a wiring pattern is formed on this substrate.

Then, as shown in FIG. 4(c), the solder resist film 9 is applied to the whole surface excluding the solder resist removed region R0 and a pad formation region of the wiring part by a roll coat method. A principal agent made of PSR-4000 EG30 and a curing agent made of CA-40G23K manufactured by TAIYO INK CO., LTD. are mixed with a dilution agent and the agents are applied so as to become a film thickness of 25 μm and temporary drying is performed for 50 minutes at 80° C. and permanent curing is performed for 60 minutes at 150° C.

According to this configuration, by forming the region R0 in which the solder resist is selectively removed, the adhesive 6 is sufficiently supplied to this selectively removed region R0 and is fastened with good adhesion so as to become parallel to the structural body 2 constructing the circuit substrate. Thus, variations in the amount of the adhesive are suppressed and the translucent member 5 can be fastened to a front surface of the structural body. Also, the region R0 in which the solder resist is selectively removed is formed in a region of bonding to the lens unit 7 fastened to a peripheral edge part of a fastening region of the translucent member 5 and thereby, the strength of adhesion between the lens unit 7 and the structural body 2 can be improved. By being formed thus, the lens unit 7 can be fastened with good adhesion so as to become parallel to the structural body 2. Thus, variations in the amount of the adhesive are suppressed and the translucent member 5 and the lens unit 7 can be fastened to the front surface of the structural body.

The area of contact between the translucent member and the structural body such as a printed wiring board becomes very small because of a demand for miniaturization of a monitoring camera, a medical camera, a vehicle-mounted camera, an information communication device, an information communication terminal camera, etc. According to the configuration described above, the region R0 in which the solder resist is removed is filled with the adhesive, and adhesion can efficiently be performed without variations in a distance between the translucent member and the structural body such as the printed wiring board.

<Solder Resist Film>

Materials of the solder resist film are not limited to the example described above, and various materials such as thermosetting epoxy or polyimide can be applied.

Also, in the embodiment, the film thickness of the solder resist film is set at 25 μm, but is desirably set at about 15 to 35 μm.

In addition, in the embodiment, the solder resist is applied by the roll coat method, but a pattern of a solder resist may be drawn by washing out the unnecessary portion with a developing solution after the solder resist is applied and exposed to the whole surface of the substrate using an alkaline development type solder resist. A desired film thickness may be obtained by two coatings depending on viscosity of the solder resist.

<Adhesive>

As an adhesive used herein, a vinyl chloride resin, a urethane resin, their mixtures, etc. are effective. Since the adhesive is a vinyl series, even when the adhesive is cured, the hardness does not become high and the adhesive hardens somewhat softly like a soft resin, so that damage to the translucent member can be avoided. In addition to this, general epoxy resins may be used naturally.

<Sealing Adhesive>

As a sealing adhesive, various resins such as an epoxy resin, a urethane resin, an oxetane resin and various other modified resins can be applied for the purpose of fixing the solid-state imaging element.

<Substrate>

As a substrate, a rigid substrate is often used, but a rigid flexible substrate in which the rigid substrate and a flexible substrate are pasted can also be applied.

As the rigid substrate, a paper phenol substrate, a glass composite substrate, a glass epoxy substrate, an alumina ceramic substrate, a low-temperature simultaneous calcined ceramic substrate, a composite substrate, a halogen-free substrate, etc. can also be applied.

The paper phenol substrate is a substrate in which paper is impregnated with a phenol resin, and has good workability at low cost, so that the paper phenol substrate is used for mass-producing a substrate for consumer equipment by punching by press. On the other hand, the mechanical strength is low and warpage tends to occur. Normally, the paper phenol substrate is used as a single-sided substrate.

A paper epoxy substrate is a substrate in which paper is impregnated with an epoxy resin, and has an intermediate feature of paper phenol and glass epoxy.

The glass composite substrate is a substrate impregnated with an epoxy resin in a state of stacking cut and arranged glass fibers, and is used as an inexpensive double-sided substrate.

The glass epoxy substrate is a substrate in which stacked fabrics (cloths) made of glass fibers are impregnated with an epoxy resin, and has good electrical characteristics and mechanical characteristics. The glass epoxy substrate is expensive, but an increase in demand of recent years tends to reduce the price. The glass epoxy substrate is most commonly used as a substrate for surface mounting. The glass epoxy substrate is used in a multilayer substrate having layers more than or equal to a double-sided substrate.

Also, the glass epoxy substrate includes a substrate using Teflon (registered trademark) in an insulating material, and this substrate has good high-frequency characteristics, so that the substrate is used in a circuit of a UHF or SHF band.

Further, the alumina ceramic substrate is a kind of fine ceramics manufactured by calcining a substance in which a pattern is formed and laminated on alumina (aluminum oxide) called a green sheet by tungsten etc.

Also, the low-temperature simultaneous calcined ceramic substrate is a substrate obtained by mixing ceramics with glass and calcining at a low temperature of about 800° C., and copper can be used in wiring. Passive components such as a coil or a capacitor can also be manufactured inside the substrate by making use of characteristics in which a coefficient of thermal expansion is small and insulating characteristics are good.

Also, the composite substrate is a substrate in which a paper epoxy substrate is formed on both surfaces around a glass epoxy substrate, and has workability better than only the glass epoxy substrate.

Also, the halogen-free substrate has the same structure as the glass epoxy substrate, but is a multilayer substrate without including a halogen flame-retardant material such as fluorine, chlorine, bromine or iodine, and can suppress a toxic substance produced at the time of recycling incineration.

Second Embodiment

Next, a second embodiment of the invention will be described.

Figure 6:
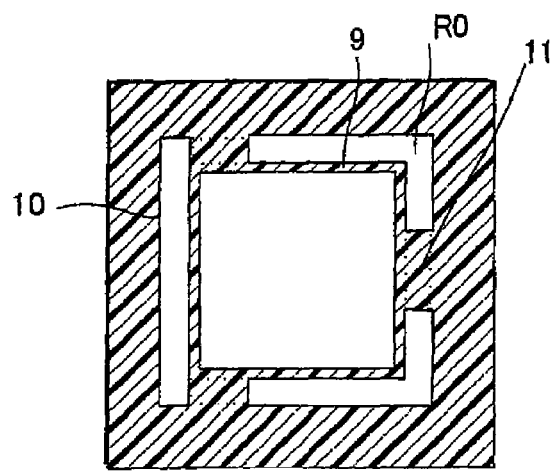
FIGS. 6(a) to 6(d) are diagrams showing modified examples of solder resist patterns in the second embodiment.
Figure 6:
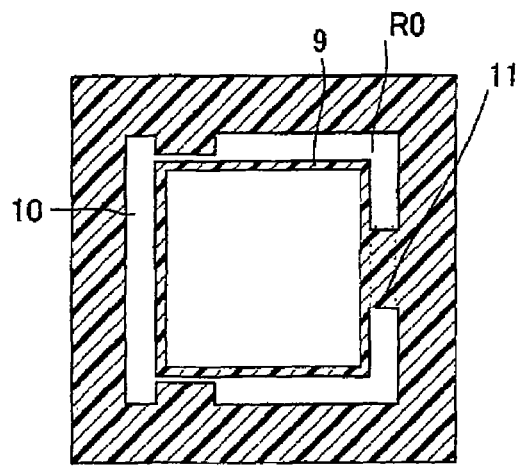
Figure 6:
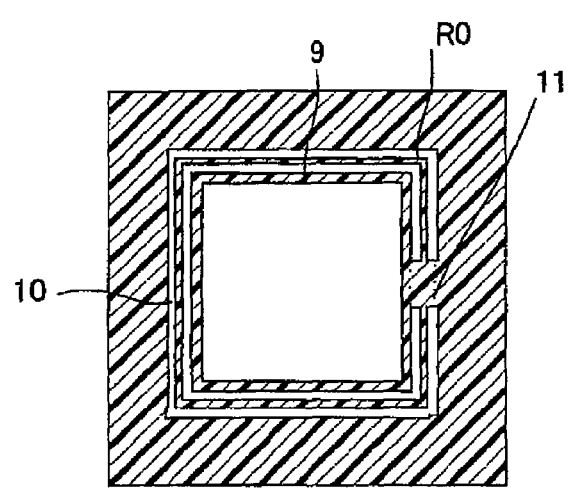
Figure 6:
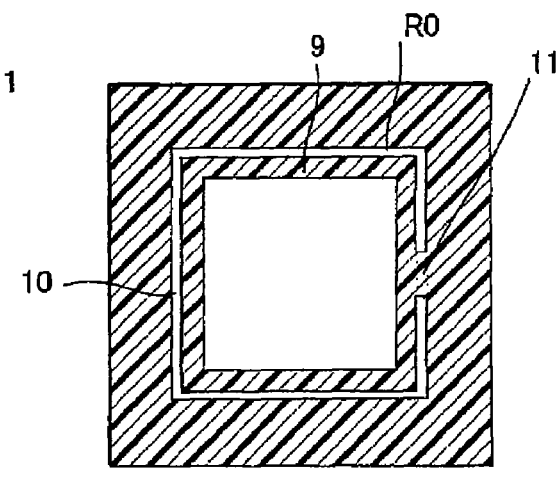

FIGS. 5(a), 5(b), and 6 show a solid-state imaging apparatus of the second embodiment of the invention. FIG. 5(a) is a schematic sectional view and FIG. 5(b) is a top view of this solid-state imaging apparatus. FIG. 5(a) is a sectional view taken on line A-A of FIG. 5(b).

The present embodiment is characterized in that a shape of a region R0 in which a solder resist is removed is adjusted so as to have an air escape part 11 as a communication region in which space of a through opening 1 communicates with the outside air. In the embodiment, the space of the through opening 1 generated by arranging a solid-state imaging element 3 and a translucent member 5 in a state of sandwiching a structural body 2 from both sides communicates with the outside air through the air escape part 11 provided by a situation in which an adhesive 6 is not supplied partially, and air can enter and exit freely and thereby, a configuration in which a difference in atmospheric pressure of the inside and outside hardly occurs is obtained.

By this configuration, parallelism of the translucent member and the solid-state imaging element can be maintained to obtain a mounted body with a hard strength like the first embodiment. Also, occurrence of deformation or accumulation of gas in the space of the through opening 1 generated by arranging the solid-state imaging element 3 and the translucent member 5 can be avoided and further the following disadvantages can be avoided.

For example, air can enter and exit freely and thereby, the configuration in which a difference in atmospheric pressure of the inside and outside hardly occurs is obtained, so that a failure of electrical connection between the structural body 2 and the solid-state imaging element 3 due to stress by increase in internal pressure can be prevented.

Also, peeling of the solid-state imaging element 3 due to the stress by increase in internal pressure can be avoided.

Or, peeling of the translucent member 5 due to the stress by increase in internal pressure can be avoided.

Or, contamination of the translucent member and an imaging area due to the residue of a gas component can be prevented.

Moreover, in addition to the structure shown in FIGS. 5(a) and 5(b), the air escape part can be modified as shown in schematic diagrams in FIGS. 6(a) to 6(d). A mask pattern for forming a pattern of a solder resist has only to be changed.

In a structure shown in FIG. 6(a), a region R0 in which a solder resist film 9 is removed is divided into three pieces, and is constructed so as to enable three-point support by the solder resist film 9. In this example, a film thickness of an adhesive 6 is constructed so as to become thicker than that of the solder resist film 9 and a region sandwiched in the region R0 in which the solder resist film 9 is removed constructs air escape parts 11 as shown by a broken line. The air escape parts 11 are gaps resulting from a difference between the film thicknesses of the adhesive 6 and the solder resist film 9.

A structure shown in FIG. 6(b) is a modified example of the structure shown in FIG. 6(a), and is constructed so as to enable three-point support by a solder resist film 9 and also an air escape part 11 is formed in one place. Also in this example, a film thickness of an adhesive 6 is constructed so as to become thicker than that of the solder resist film 9 and a region sandwiched in a region R0 in which the solder resist film 9 is removed constructs the air escape part 11 as shown by a broken line. This air escape part 11 is a gap resulting from a difference between the film thicknesses of the adhesive 6 and the solder resist film 9.

In a structure shown in FIG. 6(c), a region R0 in which a solder resist film 9 is removed is formed in a double structure and the area of contact with an adhesive can be increased more and the structure has an effect of improving the adhesive strength. Here, an air escape part 11 is also formed in one place. Also in this example, a film thickness of an adhesive 6 is constructed so as to become thicker than that of the solder resist film 9 and a region sandwiched in the region R0 in which the solder resist film 9 is removed constructs the air escape part 11 as shown by a broken line. This air escape part 11 is a gap resulting from a difference between the film thicknesses of the adhesive 6 and the solder resist film 9.

In a structure shown in FIG. 6(d), a region R0 in which a solder resist film 9 is removed is formed in a single structure and the structure has effects capable of achieving miniaturization and also maintaining the adhesive strength. Here, an air escape part 11 is also formed in one place. Also in this example, a film thickness of an adhesive 6 is constructed so as to become thicker than that of the solder resist film 9 and a region sandwiched in the region R0 in which the solder resist film 9 is removed constructs the air escape part 11 as shown by a broken line. This air escape part 11 is a gap resulting from a difference between the film thicknesses of the adhesive 6 and the solder resist film 9.

Third Embodiment

Next, a third embodiment of the invention will be described.

Figure 7:
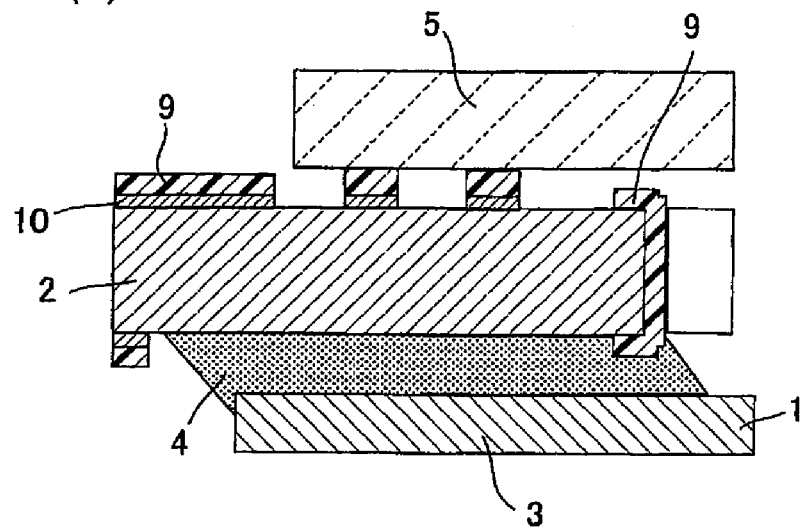
FIGS. 7(a) and 7(b) are views showing a solid-state imaging apparatus of a third embodiment and FIG. 7(a) is a main sectional view and FIG. 7(b) is a main top view.
Figure 7:
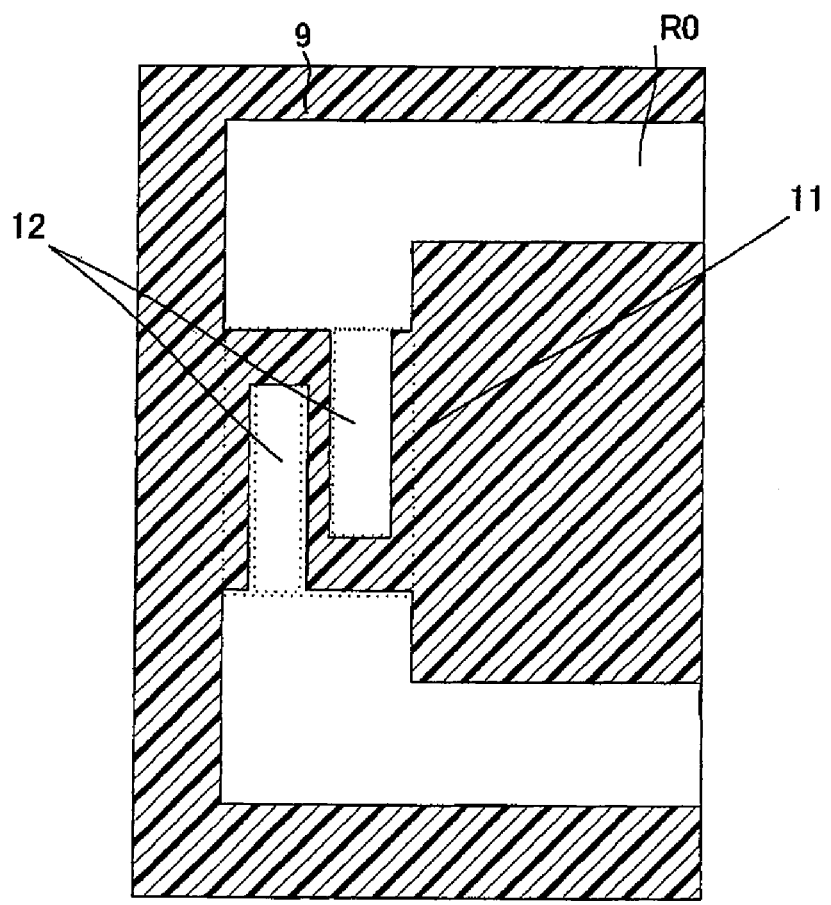

FIGS. 7(a) and 7(b) show a solid-state imaging apparatus of the third embodiment of the invention. FIG. 7(a) is a main enlarged schematic sectional view and FIG. 7(b) is a top view of this solid-state imaging apparatus.

The present embodiment is an example of modifying the air escape part 11 in the second embodiment and is configured to form a dust trap pocket 12 inside the air escape part 11 in at least one place by providing a laminated structure of a solder resist film 9 and a wiring part 10 in at least one place so that the air escape part 11 has a relation of intersecting with an airflow direction. Also in this example, a film thickness of an adhesive 6 is constructed so as to become thicker than that of the solder resist film 9 and a region sandwiched in a region R0 in which the solder resist film 9 is removed constructs the air escape part 11 as shown by a broken line. This air escape part 11 is a gap resulting from a difference between the film thicknesses of the adhesive 6 and the solder resist film 9.

According to this configuration, dust can be prevented from entering space of a through opening 1 from the outside.

Therefore, the dust can be prevented from entering the space of the through opening 1 from the outside while having the air escape part.

Moreover, in addition to the structure shown in FIGS. 7(a) and 7(b), the dust trap pocket 12 can be changed properly and can be modified as shown in schematic diagrams in FIGS. 8(a) to 8(d). A mask pattern for forming a pattern of a solder resist has only to be changed. Also in the following configurations, a film thickness of an adhesive 6 is constructed so as to become thicker than that of the solder resist film 9 and a region sandwiched in a region R0 in which the solder resist film 9 is removed constructs an air escape part 11 as shown by a broken line. This air escape part 11 is a gap resulting from a difference between the film thicknesses of the adhesive 6 and the solder resist film 9.

Figure 8:
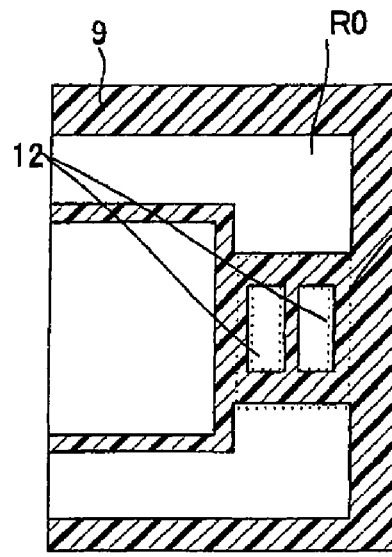
FIGS. 8(a) to 8(d) are main sectional diagrams of circuit substrates of the solid-state imaging apparatus of modified examples of the third embodiment.
Figure 8:
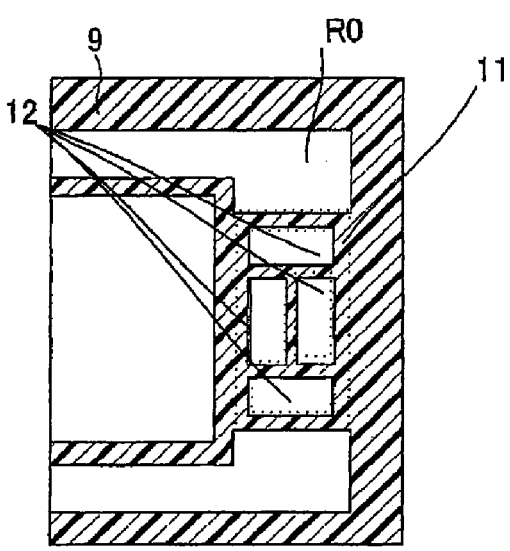
Figure 8:
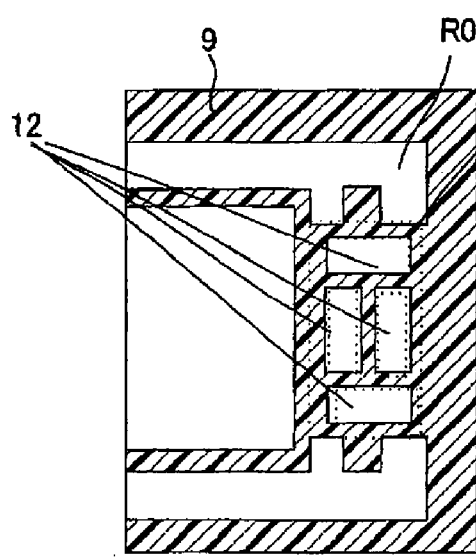
Figure 8:
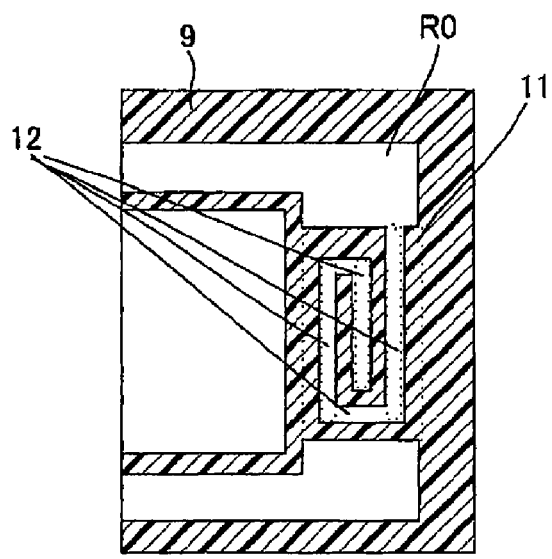

A structure shown in FIG. 8(a) shows the case where a region R0 in which a solder resist film 9 is removed, constructing dust trap pockets 12 in an air escape part 11 has simple parallel stripes.

A structure shown in FIG. 8(b) shows the case where a region R0 in which a solder resist film 9 is removed, constructing dust trap pockets 12 in an air escape part 11, adds two stripes in an orthogonal direction in addition to the structure shown in FIG. 8(a).

A structure shown in FIG. 8(c) shows the case where a region R0 in which a solder resist film 9 is removed, constructing dust trap pockets 12 in an air escape part 11, further forms a recessed part in the end of a pattern in addition to the structure shown in FIG. 8(b).

A structure shown in FIG. 8(d) shows the case where a region R0 in which a solder resist film 9 is removed, constructing dust trap pockets 12 in an air escape part 11, forms a meander-shaped pattern. In this case, a passage of dust becomes complicated and a dust trap effect can be exerted more efficiently.

In addition, the region in which the solder resist is removed, that is, the adhesion region filled with the adhesive is not limited to the embodiments described above, and can properly be changed, for example, a comb-shaped pattern is constructed. By constructing the comb-shaped pattern, the area of contact with the adhesive can be increased and there is an effect of improving the adhesive strength more. Also, an entrance path of dust becomes more complicated and there is also an effect of improving dust trap efficiency.

By devising the structure of the region in which the solder resist is removed, that is, the adhesion region filled with the adhesive thus, dust can be prevented from entering and it becomes unnecessary to provide a hermetically sealing step in a post-step.

As described above, substantially a constant thickness of an adhesive can be ensured without requiring a sophisticated process for ensuring the adhesive thickness, and inclination of a translucent member or trouble such as peeling of the translucent member resulting from variations in adhesion thickness can be prevented and by devising the structure, dust can be prevented from entering and it becomes unnecessary to provide a hermetically sealing step in a post-step, so that it can be applied to miniature cameras such as a monitoring camera, a medical camera, a vehicle-mounted camera, an information communication device or an information communication terminal camera.

The present application is based on Japanese patent application (patent application No. 2010-175661) filed on Aug. 4, 2010, and the contents of the patent application are hereby incorporated by reference.

DESCRIPTION OF REFERENCE NUMERALS AND SIGNS

1 THROUGH OPENING
2 STRUCTURAL BODY
2A FIRST SURFACE
2B SECOND SURFACE
2P PAD FORMATION REGION
3 SOLID-STATE IMAGING ELEMENT
3S BUMP
4 SEALING RESIN MATERIAL
5 TRANSLUCENT MEMBER
6 ADHESIVE
7 LENS UNIT
9 SOLDER RESIST FILM
10 WIRING PART
11 AIR ESCAPE PART
12 DUST TRAP POCKET
R ADHESION REGION
R0 REGION IN WHICH SOLDER RESIST IS REMOVED

The invention claimed is:

1. A solid-state imaging apparatus comprising:
an insulating structural body formed with a through opening;
a wiring part formed on a surface of the structural body;
a solid-state imaging element connected to the wiring part and attached to the structural body so as to close the through opening;
a translucent member opposed to the solid-state imaging element so as to close the through opening and attached to the structural body through an adhesive inside an adhesion region; and
a solder resist film covering at least a part of the surface of the structural body;
wherein the adhesion region includes a region in which the solder resist film is selectively removed and the removed region is filled with the adhesive, and
a film thickness of the adhesive is constructed so as to be thicker than that of the solder resist film, and a region sandwiched in a region in which the solder resist film is removed constructs an air escape part.

2. The solid-state imaging apparatus as claimed in claim 1, wherein a dust trap pocket is provided inside the air escape part.

3. The solid-state imaging apparatus as claimed in claim 2, wherein a meander-shaped pattern is formed in a region in which the solder resist film is removed, constructing a dust trap pocket in the air escape part.

* * * * *